(12) United States Patent
Karikalan et al.

(10) Patent No.: US 9,431,371 B2
(45) Date of Patent: Aug. 30, 2016

(54) SEMICONDUCTOR PACKAGE WITH A BRIDGE INTERPOSER

(71) Applicant: BROADCOM CORPORATION, Irvine, CA (US)

(72) Inventors: Sampath K. Karikalan, Irvine, CA (US); Sam Ziqun Zhao, Irvine, CA (US); Kevin Kunzhong Hu, Cupertino, CA (US); Rezaur Rahman Khan, Irvine, CA (US); Pieter Vorenkamp, Laguna Niguel, CA (US); Xiangdong Chen, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/701,388

(22) Filed: Apr. 30, 2015

(65) Prior Publication Data
US 2015/0235992 A1    Aug. 20, 2015

Related U.S. Application Data

(62) Division of application No. 13/339,266, filed on Dec. 28, 2011, now Pat. No. 9,059,179.

(51) Int. Cl.
*H01L 25/00* (2006.01)
*H01L 25/065* (2006.01)
*H01L 23/00* (2006.01)

(52) U.S. Cl.
CPC .......... *H01L 25/0655* (2013.01); *H01L 24/49* (2013.01); *H01L 24/80* (2013.01); *H01L 24/82* (2013.01); *H01L 25/0652* (2013.01); *H01L 2924/152* (2013.01); *H01L 2924/1532* (2013.01); *H01L 2924/30105* (2013.01)

(58) Field of Classification Search
CPC ...................... H01L 23/0655; H01L 23/0657
See application file for complete search history.

(56) References Cited

U.S. PATENT DOCUMENTS

| 5,198,963 | A | 3/1993 | Gupta et al. |
|---|---|---|---|
| 6,188,578 | B1 | 2/2001 | Lin et al. |
| 6,461,895 | B1 | 10/2002 | Liang et al. |
| 7,675,163 | B2 | 3/2010 | Heydari et al. |
| 7,838,337 | B2 | 11/2010 | Marimuthu et al. |
| 8,310,063 | B2 | 11/2012 | Wang |
| 2002/0074668 | A1* | 6/2002 | Hofstee ............... H01L 23/3677 257/777 |

(Continued)

FOREIGN PATENT DOCUMENTS

| JP | 2011-044560 A | 3/2011 |
|---|---|---|
| KR | 10-2009-0034180 | 4/2009 |
| KR | 10-2011-0036249 | 4/2011 |

*Primary Examiner* — William Harriston
(74) *Attorney, Agent, or Firm* — McDermott Will & Emery LLP

(57) ABSTRACT

There are disclosed herein various implementations of semiconductor packages including a bridge interposer. One exemplary implementation includes a first active die having a first portion situated over the bridge interposer, and a second portion not situated over the bridge interposer. The semiconductor package also includes a second active die having a first portion situated over the bridge interposer, and a second portion not situated over the bridge interposer. The second portion of the first active die and the second portion of the second active die include solder balls mounted on a package substrate, and are configured to communicate electrical signals to the package substrate utilizing the solder balls and without utilizing through-semiconductor vias (TSVs).

21 Claims, 4 Drawing Sheets

(56) References Cited

U.S. PATENT DOCUMENTS

| | | |
|---|---|---|
| 2004/0135250 A1 | 7/2004 | Hung |
| 2005/0218518 A1 | 10/2005 | Jiang et al. |
| 2006/0226527 A1 | 10/2006 | Hatano et al. |
| 2007/0023921 A1* | 2/2007 | Zingher .................. H01L 23/48 257/778 |
| 2007/0080442 A1* | 4/2007 | Meyer-Berg ............ H01L 24/06 257/686 |
| 2008/0157328 A1 | 7/2008 | Kawata |
| 2008/0231311 A1 | 9/2008 | Condorelli et al. |
| 2008/0246138 A1 | 10/2008 | Gerber et al. |
| 2009/0321939 A1* | 12/2009 | Chandrasekaran ..... H01L 24/73 257/758 |
| 2010/0327424 A1 | 12/2010 | Braunisch et al. |
| 2011/0225813 A1 | 9/2011 | Leung et al. |
| 2011/0241185 A1 | 10/2011 | Koester et al. |
| 2012/0062439 A1 | 3/2012 | Liao et al. |
| 2012/0211885 A1 | 8/2012 | Choi et al. |
| 2012/0228753 A1 | 9/2012 | Ko et al. |
| 2012/0241921 A1 | 9/2012 | Lee et al. |
| 2013/0062764 A1 | 3/2013 | Jin |
| 2013/0147023 A1 | 6/2013 | Lin et al. |

* cited by examiner

SEMICONDUCTOR PACKAGE WITH A BRIDGE INTERPOSER

CROSS-REFERENCE TO RELATED APPLICATIONS

This application is a divisional of U.S. patent application Ser. No. 13/339,266, filed on Dec. 28, 2011, entitled "Semiconductor Package with a Bridge Interposer," which is hereby incorporated by reference in its entirety.

BACKGROUND

Packaging solutions continue to evolve to meet the increasingly stringent design constraints imposed by electronic devices and systems with ever higher integrated circuit (IC) densities. One solution for providing power and ground connections, as well as input/output (I/O) signals, for example, to multiple active dies within a single semiconductor package utilizes one or more interposers to electrically couple the active dies to the package substrate.

A conventional interposer implemented for such a purpose typically includes an interposer dielectric formed over a semiconductor substrate. Through-semiconductor vias (TSVs) are usually employed to provide the power and ground connections and the I/O signals to the active dies. However, leakage through the semiconductor substrate resulting from parasitic coupling amongst the TSVs can adversely affect electrical signals passing through conventional interposers.

SUMMARY

The present disclosure is directed to a semiconductor package with a bridge interposer, substantially as shown in and/or described in connection with at least one of the figures, and as set forth more completely in the claims.

DETAILED DESCRIPTION

Figure 1A:
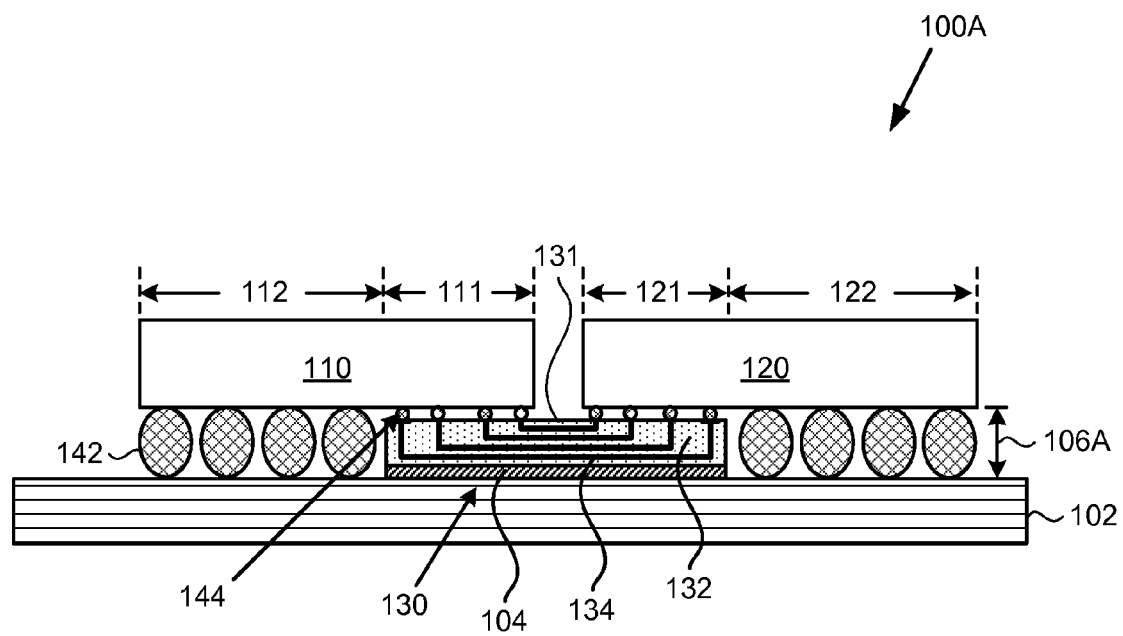
FIG. 1A shows a cross-sectional view of one implementation of a semiconductor package including a bridge interposer.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1A shows a cross-sectional view of one implementation of a semiconductor package including a bridge interposer. As shown in FIG. 1A, semiconductor package 100A includes first active die 110 having first portion 111 and second portion 112, second active die 120 having first portion 121 and second portion 122, bridge interposer 130, and package substrate 102. As further shown in FIG. 1A, bridge interposer 130 has first surface 131 facing first portions 111 and 121 of respective first and second active dies 110 and 120, and includes interposer dielectric 132 having intra-interposer routing traces 134 formed therein. Also shown in FIG. 1A are solder balls 142, micro-bumps 144, die attach film (DAF) 104 securing bridge interposer 130 to package substrate 102, and stand-off height 106A of first active die 110 and second active die 120 from package substrate 102.

It is noted that although only one exemplary intra-interposer routing trace is specifically designated by reference number 134 in FIG. 1A, any or all of the four intra-interposer routing traces shown in interposer dielectric 132 may be characterized as intra-interposer routing trace(s) 134. It is further noted that although only one each of solder balls 142 and micro-bumps 144 are specifically designated by reference numbers in FIG. 1A, any or all of the eight solder balls and eight micro-bumps shown in FIG. 1A may be characterized respectively as solder ball(s) 142 and micro-bump(s) 144.

First active die 110 and second active die 120 may be packaged or unpackaged dies, for example. Although first active die 110 and second active die 120 are shown in flip chip configuration, in FIG. 1A, that representation is merely exemplary, and in other implementations, one or both of first active die 110 and second active die 120 may exhibit a different configuration. Moreover, it is to be understood that although the implementation shown in FIG. 1A depicts two active dies coupled through bridge interposer 130, e.g., first active die 110 and second active die 120, in one implementation, more than two active dies may be coupled through bridge interposer 130.

As shown by FIG. 1A, in semiconductor package 100A, first active die 110 has first portion 111 situated over bridge interposer 130, and second portion 112 not situated over bridge interposer 130. In addition, in semiconductor package 100A second active die 120 has first portion 121 situated over bridge interposer 130, and second portion 122 not situated over bridge interposer 130. As further shown in FIG. 1A, second portion 112 of first active die 110 and second portion 122 of second active die 120 include solder balls 142 mounted on package substrate 102. As a result, first active die 110 and second active die 120 are configured to communicate electrical signals to package substrate 102 utilizing solder balls 142 and without utilizing through-semiconductor vias (TSVs). Moreover, first active die 110 and second active die 120 are also configured to communicate chip-to-chip signals through bridge interposer 130. In other words, first active die 110 and second active die 120 may utilize solder balls 142 for ground, power, and input/output (I/O) connections, for example, while communicating chip-to-chip signals using micro-bumps 144 and intra-interposer routing traces 134 formed in interposer dielectric 132 of bridge interposer 130.

Interposer dielectric 132 may be formed of a rigid dielectric material, such as fiber reinforced bismaleimide triazine (BT), FR-4, glass, or ceramic, for example. Alternatively, interposer dielectric 132 may be a flexible dielectric formed of a polyimide film or other suitable tape material. In some implementations interposer dielectric 132 may be formed of an epoxy-phenolic or cyanate ester-epoxy build-up material. As a specific example, in one implementation, interposer dielectric 132 may be formed of an Ajinomoto™ Build-up Film (ABF). According to that exemplary implementation, intra-interposer routing traces 134 can be formed during a build-up process for forming interposer dielectric 132, using any suitable technique known in the art.

According to the implementation shown in FIG. 1A, first active die 110 and second active die 120 are electrically connected to bridge interposer 130 by micro-bumps 144. It is noted, however, that more generally, micro-bumps 144 may correspond to any electrical contact bodies suitable for coupling first active die 110 and second active die 120 to bridge interposer 130. Thus, in other implementations, micro-bumps 144 may be replaced by respective conductive posts or pillars, for example, metal posts or pillars formed of copper. Alternatively, some or all of micro-bumps 144 may be substituted by alternating-current (AC) signal pads in bridge interposer 130 (AC signal pads shown and described by reference to FIGS. 2 and 3 below). That is to say, in one implementation, bridge interposer 130 may include micro-bumps 144, or other electrical contact bodies, for communicating direct-current (DC) chip-to-chip signals ("DC signals") between first active die 110 and second active die 120 through intra-interposer routing traces 134, as well as AC signal pads for communicating AC chip-to-chip signals between first active die 110 and second active die 120.

Figure 1B:
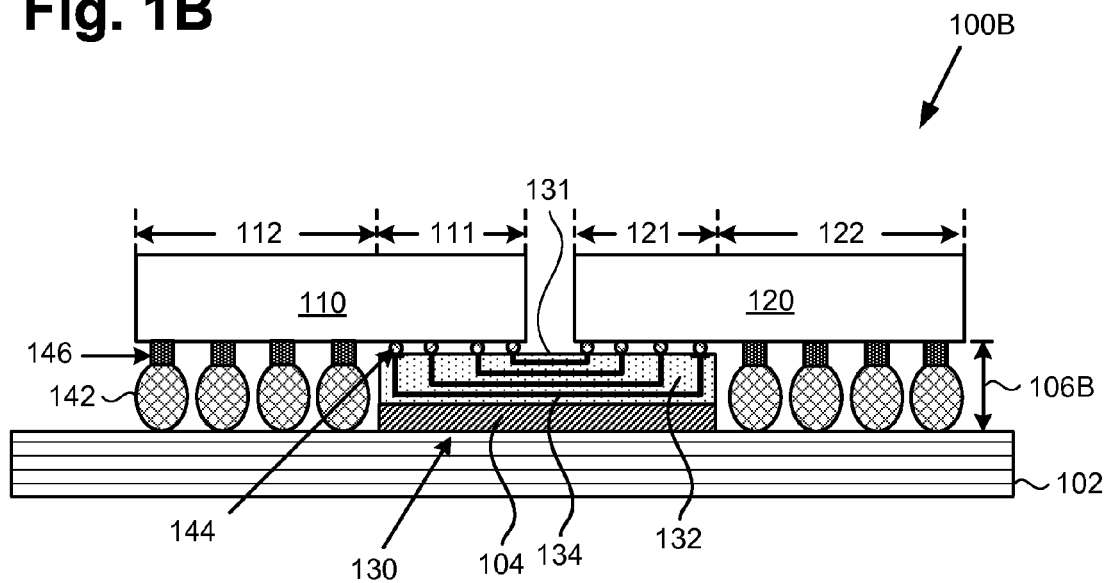
FIG. 1B shows a cross-sectional view of another implementation of a semiconductor package including a bridge interposer.

Referring now to FIG. 1B, FIG. 1B shows a cross-sectional view of another implementation of a semiconductor package including a bridge interposer. Semiconductor package 100B includes all of the features previously described by reference to FIG. 1A. In addition, semiconductor package 100B includes conductive pillars or posts 146 (hereinafter "conductive pillar(s) 146") coupling second portion 112 of first active die 110 and second portion 122 of second active die 120 to respective solder balls 142. It is noted that although only one of conductive pillars 146 is specifically designated by a reference number in FIG. 1B, any or all of the eight conductive pillars shown in FIG. 1B to couple second portion 112 of first active die 110 and/or second portion 122 of second active die 120 to a respective solder ball 142 may be characterized as conductive pillar(s) 146.

Conductive pillars 146 may be metal pillars, for example, formed on conductive pads situated on second portion 112 of first active die 110 and second portion 122 of second active die 120 (conductive pads not shown in FIG. 1B). According to one implementation, conductive pillars 146 may be copper pillars, formed using an electrochemical plating process, for example. As shown in FIG. 1B, use of conductive pillars 146 results in an increased stand-off height 106B, compared to stand-off height 106A, in FIG. 1A, and may be advantageous in situations where stand-off height 106A provided by solder balls 142 alone is inadequate. As further shown in FIG. 1B, in implementations including conductive pillars 146, first active die 110 and second active die 120 communicate electrical signals to package substrate 102 utilizing solder balls 142 and respective conductive pillars 146.

Figure 1C:
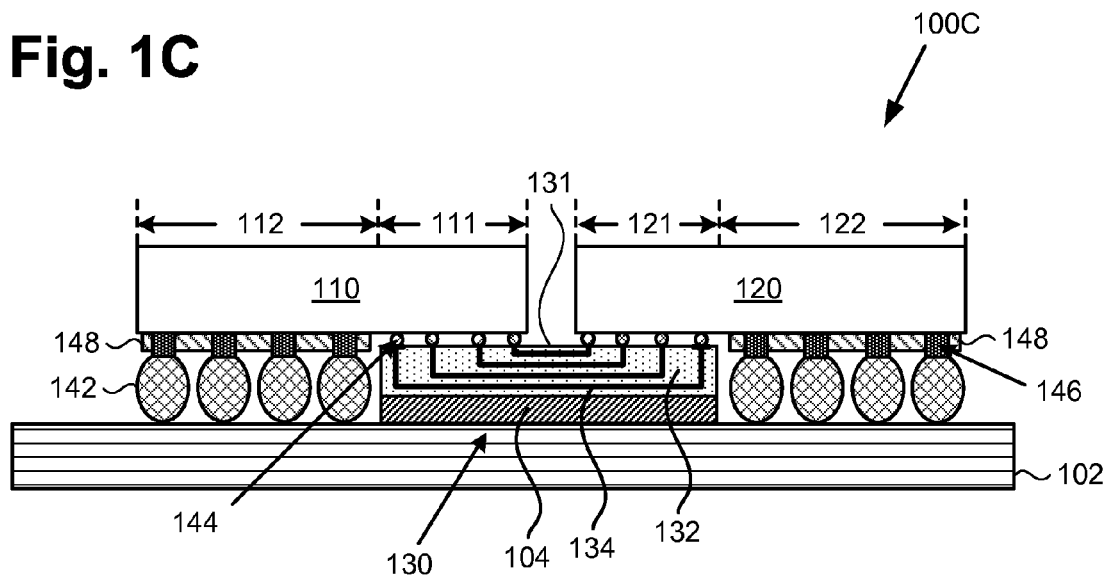
FIG. 1C shows a cross-sectional view of yet another implementation of a semiconductor package including a bridge interposer.

Continuing to FIG. 1C, FIG. 1C shows a cross-sectional view of yet another implementation of a semiconductor package including a bridge interposer. Semiconductor package 100C includes all of the features previously described by reference to FIGS. 1A and 1B. In addition, semiconductor package 100C includes passivation layer 148 formed on second portion 112 of first active die 110 and second portion 122 of second active die 120, between conductive pillars 146. Passivation layer 148 may be an oxide or nitride layer, such as a silicon nitride ($Si_3N_4$) layer, for example, formed using a chemical vapor deposition process (CVD), or any other suitable process for producing passivation layer 148. Passivation layer 148 may be provided to improve the mechanical strength and stability of ground, power, and I/O connections to package substrate 102 through solder balls 142, for example, when conductive pillars 146 are utilized.

In contrast to conventional semiconductor packages in which an interposer typically includes an interposer dielectric layer and an interposer semiconductor substrate, semiconductor packages 100A, 100B, and 100C are implemented using bridge interposer 130 from which an interposer semiconductor substrate can be omitted. In addition, and in further contrast to conventional packaging solutions utilizing TSVs, semiconductor packages 100A, 100B, and 100C utilize conductive pillars 146 and/or solder balls 142 to provide electrical connections between first active die 110 and package substrate 102, and between second active die 120 and package substrate 102, without utilizing TSVs, while enabling communication of chip-to-chip signals between first active die 110 and second active die 120 through TSV free bridge interposer 130. As a result, semiconductor packages 100A, 100B, 100C advantageously avoid the semiconductor leakage and electrical coupling amongst TSVs that are known to adversely affect signals passing through TSVs in the conventional art.

Figure 2:
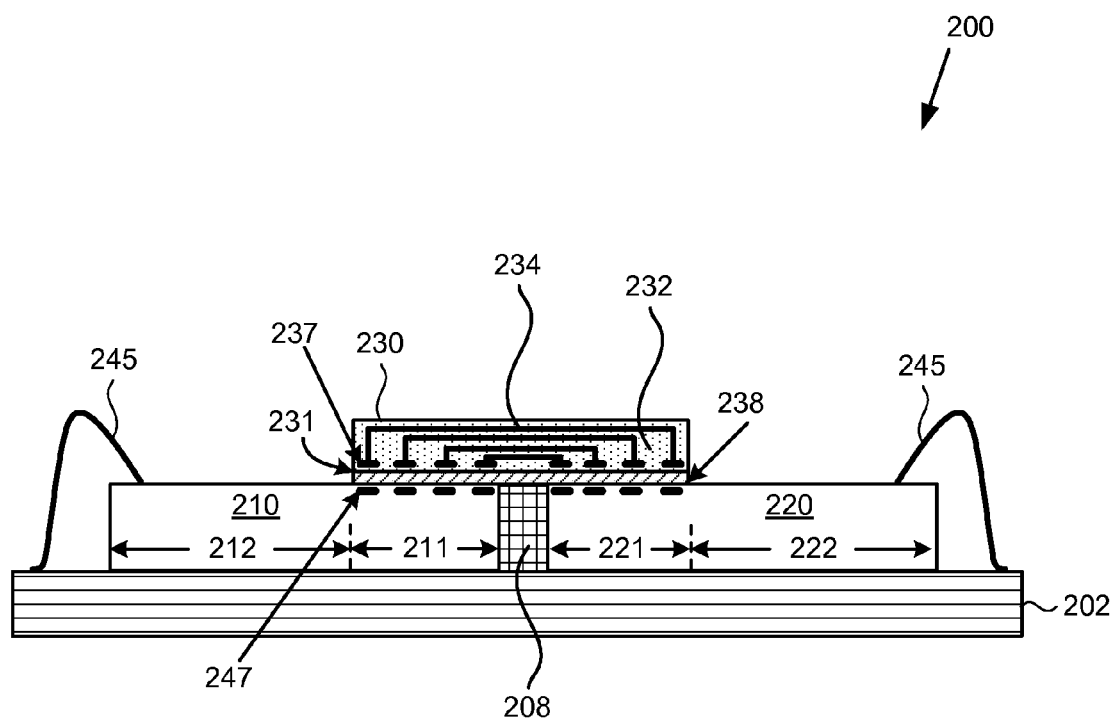
FIG. 2 shows a cross-sectional view of one implementation of a semiconductor package including a contactless bridge interposer.

Moving now to FIG. 2, FIG. 2 shows a cross-sectional view of one implementation of a semiconductor package including a contactless bridge interposer. As shown in FIG. 2, semiconductor package 200 includes first active die 210 having first portion 211 and second portion 212, second active die 220 having first portion 221 and second portion 222, bridge interposer 230, depicted as a contactless bridge interposer, and package substrate 202. As further shown in FIG. 2, bridge interposer 230 has first surface 231 facing first portions 211 and 221 of respective first and second active die 210 and 220, and includes interposer dielectric 232 having intra-interposer routing traces 234 and AC signal pads 237 formed therein. Also shown in FIG. 2 are bond wires 245, adhesion layer 238 securing bridge interposer 230 to first portion 211 of first active die 210 and first portion 221 of second active die 220, AC signal pads 247 in first portion 211 of first active die 210 and first portion 221 of second active die 220, and filler material 208 formed between first active die 210 and second active die 220.

Although only one exemplary intra-interposer routing trace is specifically designated by reference number 234 in FIG. 200, it is to be understood that any or all of the four intra-interposer routing traces shown in interposer dielectric 232 may be characterized as intra-interposer routing trace(s) 234. Moreover, although only one each of AC signal pads 237 in bridge interposer 230 and AC signal pads 247 in first active die 110 and second active die 210 are specifically designated by reference numbers in FIG. 2, any or all of the eight AC signal pads in bridge interposer 230 and the eight AC signal pads distributed between first active die 210 and second active die 220 may be characterized respectively as AC signal pads(s) 237 and AC signal pads(s) 247.

First active die 210 and second active die 220 may be packaged or unpackaged dies, for example. Although bridge interposer 230 is shown having a flip chip orientation over first portion 211 of first active die 210 and first portion 221 of second active die 220, in FIG. 2, that representation is merely exemplary, and in other implementations, the arrangement of first active die 210, second active die 220, and bridge interposer 230 may be configured differently. Moreover, it is to be understood that although the implementation shown in FIG. 2 depicts two active dies coupled through bridge interposer 230, e.g., first active die 210 and second active die 220, in one implementation, more than two active dies may be coupled through bridge interposer 230.

As shown by FIG. 2, in semiconductor package 200, first active die 210 has first portion 211 situated under bridge interposer 230, and second portion 212 not situated under bridge interposer 230. In addition, in semiconductor package 200 second active die 220 has first portion 221 situated under bridge interposer 230, and second portion 222 not situated under bridge interposer 230. As further shown in FIG. 2, first active die 210 and second active die 220 are configured to communicate chip-to-chip signals through bridge interposer 230. Moreover, and as also shown in FIG. 2, second portion 212 of first active die 210 and second portion 222 of second active die 220 are coupled to package substrate 202 by bond wires 245. In other words, first active die 210 and second active die 220 may utilize bond wires 245 to communicate electrical signals to package substrate 202, while utilizing AC signal pads 247 to communicate chip-to-chip signals through adhesion layer 238, AC signal pads 237 in bridge interposer 230, and intra-interposer routing traces 234 formed in interposer dielectric 232.

Interposer dielectric 232 may be formed of a rigid dielectric material, such as fiber reinforced BT, FR-4, glass, or ceramic, for example. Alternatively, interposer dielectric 232 may be a flexible dielectric formed of a polyimide film or other suitable tape material. In some implementations interposer dielectric 232 may be formed of an epoxy-phenolic or cyanate ester-epoxy build-up material. As a specific example, in one implementation, interposer dielectric 232 may be formed of ABF™. According to that latter exemplary implementation, intra-interposer routing traces 234 can be formed during a build-up process for forming interposer dielectric 232, using any suitable technique known in the art.

According to the implementation shown in FIG. 2, first portion 211 of first active die 210 and first portion 221 of second active die 220 are capacitively connected to bridge interposer 230 through AC signal pads 247, adhesion layer 238, and AC signal pads 237 in bridge interposer 230. Adhesion layer 238 may be formed of DAF, for example, or any material providing adhesion while concurrently possessing a dielectric constant rendering adhesion layer 238 suitable for use as a capacitor dielectric for mediating AC signaling between AC signal pads 247 and AC signal pads 237. Filler material 208 may be any material capable of providing isolating first active die 210 from second active die 220. In one implementation, for example, filler material 208 and adhesion layer 238 may be formed of the same substance, such as a DAF.

Although FIG. 2 and the present discussion focus on AC chip-to-chip signaling between first active die 210 and second active die 220, alternatively, electrical connection between first portion 211 of first active die 210 and bridge interposer 230, and between first portion 221 of second active die 220 and bridge interposer 230 may be provided using contact bodies such as micro-bumps, for example, or through a combination of contactless interconnections and contact bodies. Thus, in one implementation, bridge interposer 230 may be coupled to first portion 211 of first active die 210 and first portion 221 of second active die 220 using micro-bumps or other contact bodies for communicating DC chip-to-chip signals between first active die 210 and second active die 220, and may also be coupled to first portion 211 of first active die 210 and first portion 221 of second active die 220 using AC signal pads for communicating AC chip-to-chip signals between first active die 210 and second active die 220.

Figure 3:
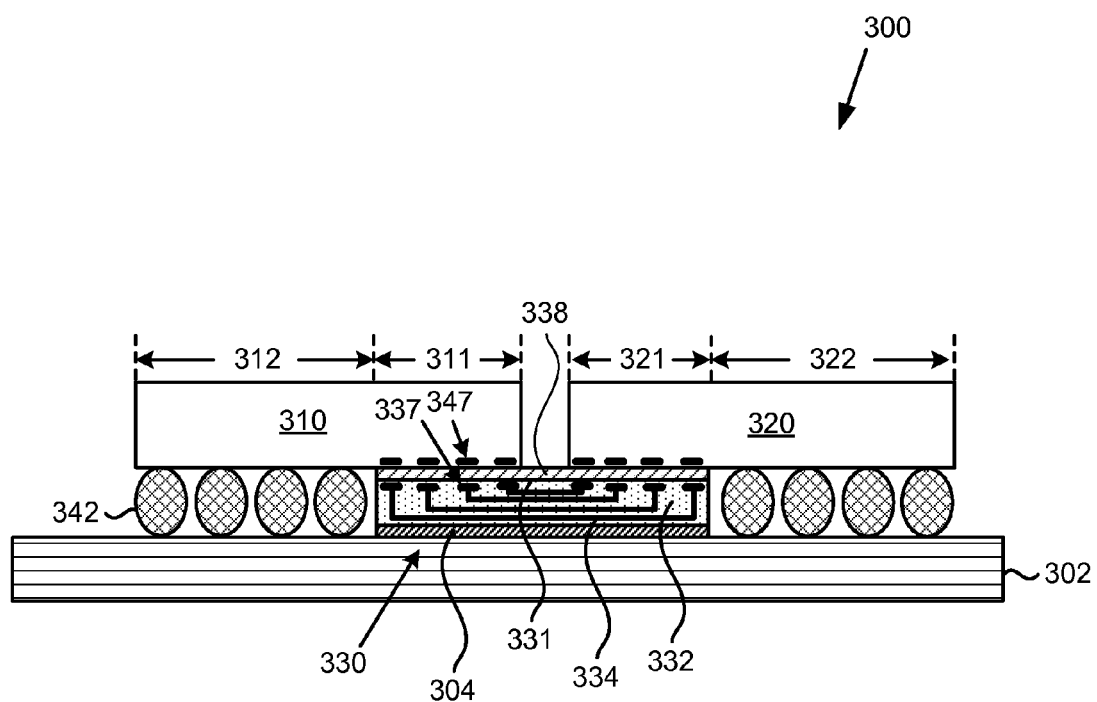
FIG. 3 shows a cross-sectional view of another implementation of a semiconductor package including a contactless bridge interposer.

Continuing to FIG. 3, FIG. 3 shows a cross-sectional view of another implementation of a semiconductor package including a contactless bridge interposer. As shown in FIG. 3, semiconductor package 300 includes first active die 310 having first portion 311 and second portion 312, second active die 320 having first portion 321 and second portion 322, bridge interposer 330, represented as a contactless bridge interposer in FIG. 3, and package substrate 302. As further shown in FIG. 3, bridge interposer 330 has first surface 331 facing first portions 311 and 321 of respective first and second active dies 310 and 320, and includes interposer dielectric 332 having intra-interposer routing traces 334, as well as AC signal pads 337 formed therein. Also shown in FIG. 3 are solder balls 342, AC signal pads 347, DAF 304 securing bridge interposer 330 to package substrate 302, and adhesion layer 338 securing bridge interposer 330 to first portion 311 of first active die 310 and first portion 321 of second active die 320.

First active die 310, second active die 320, solder balls 342, DAF 304, and package substrate 302 correspond respectively to first active die 110, second active die 120, solder balls 142, DAF 104, and package substrate 102, in FIGS. 1A, 1B, and 1C, and may share the characteristics attributed to those corresponding features above. In addition, AC signal pads 347 and adhesion layer 338, in FIG. 3, correspond respectively to AC signal pads 247 and adhesion layer 238, in FIG. 2. Bridge interposer 330 having first surface 331 and including interposer dielectric 332, intra-interposer routing traces 334, and AC signal pads 337, in FIG. 3, corresponds structurally to bridge interposer 230 having first surface 231 and including interposer dielectric 232, intra-interposer routing traces 234, and AC signal pads 237, in FIG. 2, and may share the characteristics previously attributed to those corresponding features. For example, like interposer dielectric 232, in one implementation, interposer dielectric 332, in FIG. 3, may be formed of ABF™. However, it is noted that in contrast to the configuration shown in FIG. 2, in semiconductor package 300, first portion 311 of first active die 310 and first portion 321 of second active die 320 are situated over bridge interposer 330, analogously to the configuration depicted in FIGS. 1A, 1B, and 1C.

As shown in FIG. 3, first surface 331 of bridge interposer 330 includes AC signal pads 337. As further shown in FIG. 3, first portion 311 of first active die 310 is facing first surface 331 of bridge interposer 330, and first portion 321 of second active die 310 is facing first surface 331 of bridge interposer 330 as well. According to the implementation shown in FIG. 3, first active die 310 and second active die 320 are configured to communicate AC chip-to-chip signals utilizing AC signal pads 337 of bridge interposer 330. Moreover, first active die 310 and second active die 320 are configured to communicate electrical signals to package substrate 302 utilizing solder balls 342 and without utilizing through-semiconductor vias (TSVs).

As is the case for the implementation shown in FIGS. 1A, 1B, and 1C, semiconductor package 300, in FIG. 3, may be modified through addition of a passivation layer and/or conductive pillars or posts corresponding respectively to passivation layer 148 and conductive pillars 146 shown in FIGS. 1B and 1C. Furthermore, although FIG. 3 depicts AC chip-to-chip signaling between first active die 310 and second active die 320, alternatively, electrical connection between first portion 311 of first active die 310 and bridge interposer 330, and between first portion 321 of second active die 320 and bridge interposer 330 may be provided using contact bodies such as micro-bumps corresponding to micro-bumps 144 in FIGS. 1A, 1B, and 1C, for example, or through a combination of AC signal pads and contact bodies such as micro-bumps. Consequently, in one implementation, bridge interposer 330 may be coupled to first portion 311 of first active die 310 and first portion 321 of second active die 320 using micro-bumps or other contact bodies for communicating DC chip-to-chip signals between first active die 310 and second active die 320, and may also be coupled to first portion 311 of first active die 310 and first portion 321 of second active die 320 using AC signal pads for communicating AC chip-to-chip signals between first active die 310 and second active die 320.

Thus, by using a bridge interposer formed of an interposer dielectric, various implementations of the concepts disclosed herein advantageously enable a semiconductor package in which leakage through the interposer is substantially eliminated. In addition, the described implementations advantageously disclose a semiconductor package from which TSVs may be omitted. Consequently, the concepts and implementations disclosed herein enable avoidance of the adverse impacts of signals passing through TSVs in conventional semiconductor packaging solutions.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor package comprising:
a bridge interposer comprising an interposer dielectric with an intra-interposer routing trace formed in the interposer dielectric;
a first active die having a first portion situated under said bridge interposer, and a second portion not situated under said bridge interposer;
a second active die having a first portion situated under said bridge interposer, and a second portion not situated under said bridge interposer;
said first active die and said second active die configured to communicate with each other through said bridge interposer; and
a package substrate situated under said first active die and said second active die, said first active die and said second active die configured to communicate electrical signals to said package substrate utilizing bond wires,
wherein the intra-interposer routing trace has a first end for coupling to the first active die and a second end for coupling to the second active die, the entire length of the intra-interposer routing trace between the first end and the second end being within the interposer dielectric.

2. The semiconductor package of claim 1, wherein said first active die is configured to communicate direct current (DC) signals to said second active die through said bridge interposer.

3. The semiconductor package of claim 1, wherein the bridge interposer comprises alternating current (AC) signal pads, and wherein said first active die is configured to communicate AC signals to said second active die by utilizing the AC signal pads in said bridge interposer.

4. The semiconductor package of claim 1, wherein the bridge interposer further comprises a first signal pad and a second signal pad formed therein, and wherein the intra-interposer routing trace couples to the first signal pad and the second signal pad.

5. The semiconductor package of claim 1, wherein the bridge interposer comprises a first signal pad and a second signal pad formed in the interposer dielectric, and wherein the first end of the intra-interposer routing trace couples to the first signal pad and the second end of the intra-interposer routing trace couples to the second signal pad.

6. The semiconductor package of claim 1, wherein:
the bridge interposer comprises a second intra-interposer routing trace formed in the interposer dielectric,
the second intra-interposer routing trace has a first end for coupling to the first active die and a second end for coupling to the second active die, and
the entire length of the second intra-interposer routing trace being within the interposer dielectric.

7. A semiconductor package comprising:
a bridge interposer having a first surface including alternating current (AC) signal pads;
a first active die having a first portion and a second portion, the first portion of the first active die facing said first surface of said bridge interposer; and
a second active die having a first portion and a second portion, the first portion of the second active die facing said first surface of said bridge interposer, the second portion of the first active die and the second portion of the second active die including solder balls mounted on a package substrate,
wherein:
said first active die and said second active die are configured to communicate AC chip-to-chip signals utilizing said AC signal pads of said bridge interposer,
the first active die and the second active die are configured to communicate electrical signals to the package substrate utilizing the solder balls, and
the solder balls are coupled to the second portion of the first active die and the second portion of the second active die by respective conductive pillars.

8. The semiconductor package of claim 7, wherein said first active die and said second active die are configured to communicate direct (DC) chip-to-chip signals through said bridge interposer.

9. The semiconductor package of claim 7, wherein said bridge interposer comprises intra-interposer routing traces formed therein.

10. The semiconductor package of claim 7, wherein said bridge interposer comprises an interposer dielectric with an intra-interposer routing trace formed in the interposer dielectric.

11. The semiconductor package of claim 10, wherein the intra-interposer routing trace has a first end for coupling to the first active die and a second end for coupling to the second active die, the entire length of the intra-interposer routing trace between the first end and the second end being within the interposer dielectric.

12. The semiconductor package of claim 7, wherein said first active die and said second active die are configured to communicate electrical signals to said package substrate utilizing said solder balls and without utilizing through-semiconductor vias (TSVs).

13. The semiconductor package of claim 7, further comprising a passivation layer formed on said second portion of said first active die and said second portion of said second active die between said respective conductive pillars.

14. A semiconductor package comprising:
a first die comprising a structure to receive or receiving a bond wire;
a second die; and
a bridge interposer situated over at least a portion of each of the first die and the second die, wherein the bridge interposer comprises an interposer dielectric with at least one routing trace formed in the interposer dielectric, the second die configured to communicate chip-to-chip signals with the first die through the at least one routing trace,
wherein:
a portion of the first die is not situated under the bridge interposer,
the at least one routing trace has a first end for coupling to the first die and a second end for coupling to the second die, and
the entire length of the at least one routing trace between the first end and the second end being within the interposer dielectric.

15. The semiconductor package of claim 14, further comprising a package substrate having a structure to receive or receiving the bond wire.

16. The semiconductor package of claim 14, wherein the bridge interposer is devoid of conductive through-vias.

17. The semiconductor package of claim 14, wherein:
the bridge interposer comprises a first signal pad and a second signal pad formed therein, and
the first signal pad is connected to the second signal pad by the at least one routing trace.

18. The semiconductor package of claim 17, wherein:
the first die comprises a signal pad,
the second die comprises a signal pad, and
the second die is configured to communicate chip-to-chip signals with the first die through the at least one routing trace, the signal pad of the first die, the signal pad of the second die, the first signal pad, and the second signal pad.

19. The semiconductor package of claim 18, further comprising an adhesion layer between the signal pad of the first die and the first signal pad.

20. The semiconductor package of claim 14, wherein each of the at least one routing trace consists of one or more conductive materials.

21. The semiconductor package of claim 14, wherein the first die has a structure to receive the bond wire or receiving at the portion of the first die that is not situated under the bridge interposer.

* * * * *